(12) United States Patent
Schoofs et al.

(10) Patent No.: US 7,457,595 B2
(45) Date of Patent: Nov. 25, 2008

(54) POWER SAVING IN A TRANSMITTER

(75) Inventors: Franciscus Adrianus Cornelis Maria Schoofs, Eindhoven (NL); Pieter Gerrit Blanken, Eindhoven (NL); Giuseppe Grillo, Nijmegen (NL)

(73) Assignee: NXP B.V., Eindhoven (NL)

( * ) Notice: Subject to any disclaimer, the term of this patent is extended or adjusted under 35 U.S.C. 154(b) by 108 days.

(21) Appl. No.: 10/574,763

(22) PCT Filed: Oct. 1, 2004

(86) PCT No.: PCT/IB2004/051939

§ 371 (c)(1),
(2), (4) Date: Apr. 5, 2006

(87) PCT Pub. No.: WO2005/036764

PCT Pub. Date: Apr. 21, 2005

(65) Prior Publication Data
US 2007/0015475 A1    Jan. 18, 2007

(30) Foreign Application Priority Data
Oct. 10, 2003  (EP) .................................. 03103751

(51) Int. Cl.
  *H01Q 11/12* (2006.01)
  *H04B 1/04* (2006.01)
(52) U.S. Cl. .................. 455/127.1; 455/127.5; 455/126
(58) Field of Classification Search .............. 455/127.1, 455/127.5, 126
See application file for complete search history.

(56) References Cited

U.S. PATENT DOCUMENTS
5,404,586 A    4/1995  Ishiguro
(Continued)

FOREIGN PATENT DOCUMENTS
WO    WO 98/49771    11/1998

*Primary Examiner*—Edward Urban
*Assistant Examiner*—Christian A Hannon

(57) ABSTRACT

A transmitter comprises a power amplifier (PA) with a power supply input (PI) and an output (PAO) to supply a transmission signal (Vo) with an output power (Po). A power supply (PS) has power supply outputs (PSO1, PSO2) to supply a first power supply voltage (PV1) with a first level and a second power supply voltage (PV2) with a second level, higher than the first level. A switching circuit (SC) is arranged between the power supply outputs (PSOI, PSQ2) and the power supply input (PI) to supply a selected one of the first power supply voltage (PV1) or the second power supply voltage (PV2) to the power amplifier (PA). A controller (CO) supplies a control signal to the switching circuit (SC) in response to a first power change command (PC) indicating a first desired level of the output power (Po), to supply the first power supply voltage (PV1) to the power supply input (PI). The controller (CO) supplies the control signal to the switching circuit (SC) in response to a second power change command (PC) indicating a second desired level of t:1e output power (Po) and succeeding the first power change command (PC), to supply either the first power supply voltage (PV1) or the second power supply voltage (PV2) to the amplifier power supply input (PI) depending on values of said first desired level and said second desired level. The controller (CO) controls the power supply (PS) to vary a level of at least one of the power supply voltages (PV, PV2) to always have available one of the power supply voltages with a level suitable for increasing the output power (P0) substantially instantaneously.

18 Claims, 7 Drawing Sheets

U.S. PATENT DOCUMENTS

| | | | |
|---|---|---|---|
| 5,438,683 A * | 8/1995 | Durtler et al. | 455/74 |
| 5,903,193 A * | 5/1999 | Adachi | 330/279 |
| 5,903,854 A | 5/1999 | Abe et al. | |
| 6,781,452 B2 * | 8/2004 | Cioffi et al. | 330/10 |
| 7,151,947 B2 * | 12/2006 | Klomsdorf et al. | 455/522 |
| 2001/0010483 A1 * | 8/2001 | Akiya | 330/298 |

* cited by examiner

POWER SAVING IN A TRANSMITTER

The invention relates to a transmitter, a method of transmitting, and a system comprising a mobile transmitter and a base station.

Such a transmitter may be a mobile wireless transmitter as disclosed in WO 98/49771. This prior art discloses a battery life extending technique for mobile wireless applications.

Extending battery life is a key concern for users and manufacturers of cellular telephones and other portable transceivers. The output power of the transceiver is made dependent on the strength of a received signal. If possible, a lower than maximum output power is generated to decrease the power consumption and to extend the battery life. An operating voltage applied to a transmitter power amplifier in the mobile wireless transceiver is dynamically controlled so as to obtain a high efficiency of the transmitter at all output power levels. In an embodiment of the transmitter disclosed in WO 98/49771, a highly efficient switching regulator is controlled by a control circuit to adjust the operating voltage for the power amplifier in the transmitter. The control circuit has as its input any of a variety of signals which reflect the actual output power of the transmitter, the desired output power, or the output voltage swing of the transmitter.

The operating voltage or power supply voltage is varied in accordance with the required average output power. Usually, the time to vary the operating voltage is limited. A high switching frequency of the power supply is required to change and settle the switching regulator voltage or power supply voltage within a short period of time. This high switching frequency decreases the efficiency of the power supply and increases the complexity of the design.

It is an object of the invention to provide a transmitter with power saving in which the requirements imposed on the power supply are less stringent.

A first aspect of the invention provides a transmitter as claimed in claim 1. A second aspect of the invention provides a method of transmitting as claimed in claim 16. A third aspect provides a system comprising a mobile transmitter and a base station as claimed in claim 18. Advantageous embodiments of the invention are defined in the dependent claims.

The transmitter in accordance with the first aspect of the invention comprises a power amplifier which supplies a transmission signal with a predetermined output power. The power amplifier has a power-supply input to receive a power supply voltage. On the one hand, the power supply voltage should have a level sufficiently high to enable the power amplifier to supply the output power requested. On the other hand, the power supply voltage should have as low a level as possible to minimize the power consumption which is extremely important in handheld battery operated transmitters.

For example, in state of the art mobile and wireless communication schemes, the average output power of the power amplifier is set by the network. As a consequence, the power amplifier need not operate continuously at maximum output power. For example, in (W)-CDMA (Code Division Multiple Access) systems, usually a 10 dB lower output power is required. The output power is varied in order to cope with the communication requirements. For example, in (W)-CDMA systems, the output power is varied in order to maximize the cell capacity. The base station measures the received power from the handset and sends power control commands to the handset to adjust the output power to a desired value. This is called Power Control Loop, an example of which is described for UMTS in ETSI 2001, UMTS TETRA standard, chapter TS125.101, and ETSI 2001, UMTS TETRA standard, chapter TS125.214. In a UMTS-compatible handset, the power supply voltage has to change and settle within 50 microseconds. It is also possible to use other triggers to change the output power and to adapt the power supply voltage accordingly.

The power supply in accordance with the first aspect of the invention has power supply outputs to supply a first power supply voltage with a first level and a second power supply voltage with a second level being higher than the first level. A switching circuit is arranged between the power supply outputs and the power supply input of the amplifier. A controller has an input for receiving a power change command. It is assumed that in response to a previous power change command, the first power supply is supplied to the power amplifier. The second power supply with the higher level is not used. In response to a next power change command, the controller controls the switching circuit to supply either the first power supply voltage or the second power supply voltage to the power amplifier power supply input. The availability of two different power supply voltages allows selecting the more appropriate power supply voltage level for the requested output power as indicated by the power change command, immediately, or almost immediately at the instant the next power change command is received. It is not required to change a level of a single power supply voltage within a short period of time.

It is in particular important that always a higher power supply level is present to be used substantially immediately, because in many applications it must be possible to supply the higher output power within a very short time. It is not that important to have a lower power supply level available within a short time. A lower level of the power supply voltage can be easily reached by just switching off the power supply until the level of the output voltage, which is higher than the optimal value, drops to the desired lower level. Also, this is not a problem for the power consumed from a battery if the transmitter is battery-operated because the power consumption of the switched-off power supply is substantially zero.

The adaptive biasing of the power amplifier PA such that the power supply voltage PV is adapted to fit the average output power which is known in advance, can be used, for example, in GSM, UMTS, CDMA, IS95, CDMA2000 and W-CDMA mobile communication systems, and in all other wireless systems in which an output power variation is required.

In an embodiment as defined in claim 2, the transmitter is a handheld apparatus such as, for example, a GSM phone which further comprises a receiving circuit to receive commands from a base station. The base station detects the power received from the handheld apparatus and transmits power control commands indicating to the handheld apparatus at which output power the handheld should transmit. In favorable transmission situations or when near the base station, a lower output power will suffice. The lower output power extends the battery life of the battery in the handheld apparatus. The control of the output power of the handheld apparatus by the base station has the advantage that the base station is able to monitor the complete system and to optimize the cell capacity.

In an embodiment as defined in claim 3, the transmitter operates in a transmission system based on time slots. Usually, the power control commands are received at a predetermined time before starts of transition periods, which usually start before the end of the time slots. The output power of the transmitter is expected to be changed during the transition periods, which usually cover the end of a time slot and/or the start of the corresponding successive time slot. The time slots are also referred to as transmission slots, or slots. The base station transmits power control commands to the handheld transmitter which indicate the predetermined output power required during the next transmission slot.

The control circuit controls the switching circuit to select the most appropriate power supply voltage, as soon as the power control command is received or at the last at the start of the next time slot. If the power has to decrease, preferably, the higher power supply voltage is kept until the transition period. If the power has to increase, the higher power supply voltage may be applied immediately or during the transition period. The power supply voltage of the amplifier is expected to change within this transmission period such that the correct power supply voltage is present during the slot when the transmitter has to transmit information. Preferably, the control circuit supplies the control signal to the switching circuit to select the appropriate one of the two different power supply voltage levels after the start of the transition period, thus before or after the end of the current time slot. Always one of these two available power supply voltage levels is higher than the level supplied to the power amplifier at the instant the power control command is received. The selected power supply voltage will be used during the next time slot. If again a power control command is received, again a decision is taken which one of the levels is the more appropriate one to be used in the successive slot And again care is taken that the power supply voltage which is not supplied to the power amplifier has a higher level than the power supply voltage which is supplied to the power amplifier.

Thus, because always when a power control command from the base station is received already a power supply voltage is available with a level higher than the power supply voltage which is supplied to the power amplifier, it is possible to select this higher level power supply voltage immediately or as soon as required. The power supply voltage supplied to the power amplifier is also referred to as the power supply voltage used or the selected power supply voltage, while the power supply voltage which is not supplied to the power amplifier is also referred to as the non-used power supply voltage or the non-selected power supply voltage. It is not required to control the power supply to change the level of the power supply voltage which is supplied to the power amplifier within the transition period which has a relatively short duration with respect to the duration of a time slot. A whole time slot is available to change the level of the non-used power supply voltage to get a higher level than the used power supply voltage.

In the prior art, the power supply voltage has to be changed during the short transition period. This requires an expensive power supply which operates at a high switching frequency and has a complex control loop. The power supply in accordance with the invention has to change the level of one of the power supply voltages in a period of time which is at least as long as a time slot. The duration of a time slot is much longer than the duration of a transition period. Consequently, the power supply in accordance with the invention is less complex and is easier to design.

To conclude, the adaptive power supply voltage approach in accordance with a preferred embodiment of the invention selects the power supply voltage used by the power amplifier from a number of adaptable power supply voltages generated by a highly efficient DC/DC converter. Always, at an instant when the output power of the amplifier may change, at least one of the non-selected power supply voltages has a level which is higher than the level of the power supply voltage supplied to the power amplifier. This higher level of the non-used power supply voltage should be sufficiently higher than the level of the power supply voltage used. The transmitter, which in this embodiment is a handset, may operate in a system with a base station. Then, a control loop is present between the handset and the base station. In such a control loop it is known that each power control command may indicate a fixed positive or negative change of the transmitting power, for example ±1 dB, ±2 dB, or ±3 dB. The optimal higher or lower level of the power supply voltage of the amplifier is determined by the amount of the fixed change. The availability of the higher level allows selecting the higher level as soon as required. It is thus not required to change the output voltage of the power supply within the short transition time.

For example, in UMTS, the transition period lasts 50 microseconds and the power control command is issued 108 microseconds before the transition period, and a time slot has a duration of 667 microseconds. Because always a non-used higher power supply level is present, it is always possible to select this higher level during a transition period if it is known that the output power has to increase. After the switch over to the higher power supply voltage, the lower power supply voltage level not used now has to be increased to a level higher than the level now used. The increase of the lower level can be performed during the time slot of 667 microseconds lasting quite long.

It is not required that the power control command issued by the base station is used to obtain a power change command to control the switching circuit with the controller. It suffices if the information about the required power output change of the power amplifier becomes available during the transition period, or preferably, is available at the start of the transition period. It is not relevant to the invention how this information is obtained. In transmission systems like UMTS, preferably the available power control command is used to obtain the power change command. Thus, if the instant the power change command is received is referred to, this does not mean that only the signal transmitted by the base station 108 microseconds before the transition period is meant. Preferably, the power change command is this power control command transmitted by the base station. But any other signal indicating the power required during the next time slot and occurring or being determined before the next time slot can be used.

In an embodiment as defined in claim 4, during the present time slot, at the instant the second power change command is received, the starting situation is that the first power supply voltage is supplied to the power amplifier and the unused second power supply voltage with the higher level is available. The second power change command indicates that the output power in the next time slot has to increase. The control circuit controls the switching circuit to select the second power supply voltage as the power supply of the power amplifier. This might occur immediately after the power change command is received or during the transition period. After switching over to the second power supply voltage, the controller controls the power supply to increase the first power supply voltage no longer used now, so that it becomes the required amount higher than the second power supply voltage used now. The first power supply voltage should have the required level before the start of the time slot succeeding a next power change command. Thus, the period of time available to change the level of the first power supply voltage is much larger than the duration of the transition period.

In an embodiment as defined in claim 5, again, during the present time slot, at the instant the second power change command is received, the starting situation is that the first power supply voltage is supplied to the power amplifier and the unused second power supply voltage with the higher than optimal level is available. The second power change command indicates that the output power in the next time slot has to decrease. Although the level of the first power supply voltage is higher than the optimal level, the control circuit controls the switching circuit to still select the first power supply voltage as the power supply voltage for the power amplifier. The controller controls the power supply to decrease the level of the non-used second power supply voltage so that it becomes the required amount lower than the first power supply voltage.

In an embodiment as defined in claim 6, the controller switches over to the second power supply voltage as soon as the second power supply voltage has the required level below the level of the first power supply voltage. The first power supply voltage has now automatically the predetermined level higher than the second power supply voltage and the system is ready for a next power change command. Preferably, the level of the second power supply voltage has reached the required lower level within one time slot.

In an embodiment as defined in claim 7, the controller switches over to the second power supply if a next power change command indicates that the lower output power indicated by the previous power change command is still required. The power supply voltage of the power amplifier is higher than optimal during one time slot only. This is not a problem in the system because a higher than optimal power supply voltage during such a short period of time only causes a marginal amount of superfluous power to be drawn from the battery.

In an embodiment as defined in claim 8, the controller switches over to the second power supply if a next power change command indicates that even a lower power than indicated by the previous power change command is required. The power supply voltage of the power amplifier is higher than optimal during one time slot only. This is not a problem in the system because a higher than optimal power supply voltage during such a short period of time only causes a marginal amount of superfluous power to be drawn from the battery.

In an embodiment as defined in claim 9, again, during the present time slot, at the instant the second power change command is received, the starting situation is that the first power supply voltage is supplied to the power amplifier and the unused second power supply voltage with the higher level is available. The second power change command indicates that the output power in the next time slot has to decrease. The control circuit controls the switching circuit to select the higher-than-optimal second power supply voltage as the power supply of the power amplifier. The controller controls the power supply to decrease the level of the second power supply voltage such that it becomes the required amount lower than the first power supply voltage, while the level of the first power supply voltage is kept substantially constant. The decreasing level of the second power supply voltage is, for example, obtained by switching off the power supply. The load on the second power supply voltage will discharge a capacitor connected to the power supply output which supplies the second power supply voltage. If the voltage on the capacitor has dropped to the required value, the power supply is activated again. Usually, the load is dominantly determined by the current drawn by the power amplifier, and preferably the value of the capacitor is selected to obtain a voltage drop corresponding with one output power level decrease within one time slot or less.

In an embodiment as defined in claim 10, again, during the present time slot, at the instant the second power change command is received, the starting situation is that the first power supply voltage is supplied to the power amplifier and the unused second power supply voltage with the higher level is available. The second power change command indicates that the output power in the next time slot has to decrease. The control circuit controls the switching circuit to still select the higher-than-optimal first power supply voltage as the power supply of the power amplifier. The controller controls the power supply to allow the level of the first power supply voltage to decrease.

In an embodiment as defined in claim 11, the level of the non-used second power supply voltage is kept substantially constant. Only the level of one power supply voltage has to be controlled.

In an embodiment as defined in claim 12, the power supply supplies three power supply voltages. One of the power supply voltages is supplied to the power amplifier. The levels of the two other power supply voltages are controlled such that one has a level higher than the level of the power supply voltage supplied to the power amplifier while the other has a level lower than the level of the power supply voltage supplied to the power amplifier. At the instant required, the switching circuit selects the power supply voltage with the higher level if the output power has to increase, or the switching circuit selects the power supply voltage with the lower level if the output power has to decrease. Thus it is possible to substantially immediately switch over to the required higher or lower level of the power supply voltage at the instant required. The instant required is usually the start of a next transition period or any instant within the transition period. This has the advantage that it is not required to change the level of the power supply voltage within a short time period lasting from the instant it is known that the output power should be changed and the start of the next transition period. Also if the output power decreases, it is possible to select substantially immediately the lower power supply voltage to obtain an optimal power consumption.

After selecting one of the power supply voltages which were not used in the previous time slot, the level of one of the other, non-selected, power supply voltages is adapted, or the levels of both other, non-selected, power supply voltages are adapted such that at the start of the next transition period, one of these power supply voltages has again a level above the level of the selected power supply voltage and the other one has a level which is below the level of the selected power supply voltage. Thus, of the non-selected power supply voltages one has or is made to have a lower level and one has or is made to have a higher level than the selected power supply voltage. Consequently, at the start of the next transition period, it is always possible to directly switch to the correct power supply voltage. If the maximum or minimum value of the possible power supply voltages is reached, it is of course not possible to supply one of the non-selected power supply voltages with a level lower than the minimum value or higher than the maximum value unless a special power converter topology is provided.

In an embodiment as defined in claim 14, the controller controls, when the output power has to be changed, the level of the one of the non-selected power supply voltages that has the largest difference with the level of the selected power supply voltage. This has the advantage that only a single power supply voltage has to be varied at a time.

In an embodiment as defined in claim 15, the controller controls, when the output power has to be changed, the level of both non-selected power supply voltages. The level of the non-selected power supply voltage that is nearest the level of the selected power supply voltage crosses the level of the selected power supply voltage. Thus, if the non selected power supply voltage which has the nearest level has a level below the level of the selected power supply voltage, the level of this non-selected power supply will be made larger than the level of the selected output voltage. The level of the other non-selected output voltage has to increase to have the same difference value to the selected output voltage level as in the earlier time slot. Although now two levels have to vary, the maximum amount of variation of the output voltage levels becomes smaller.

These and other aspects of the invention are apparent from and will be elucidated with reference to the embodiments described hereinafter.

Figure 4:
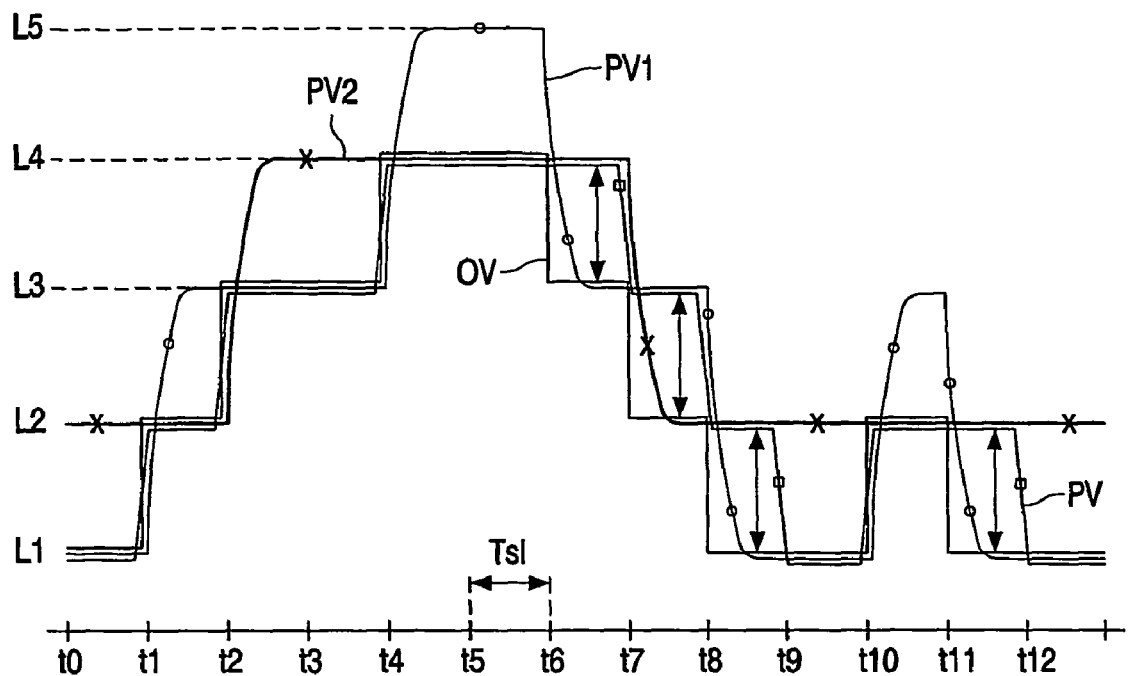
Figure 6:
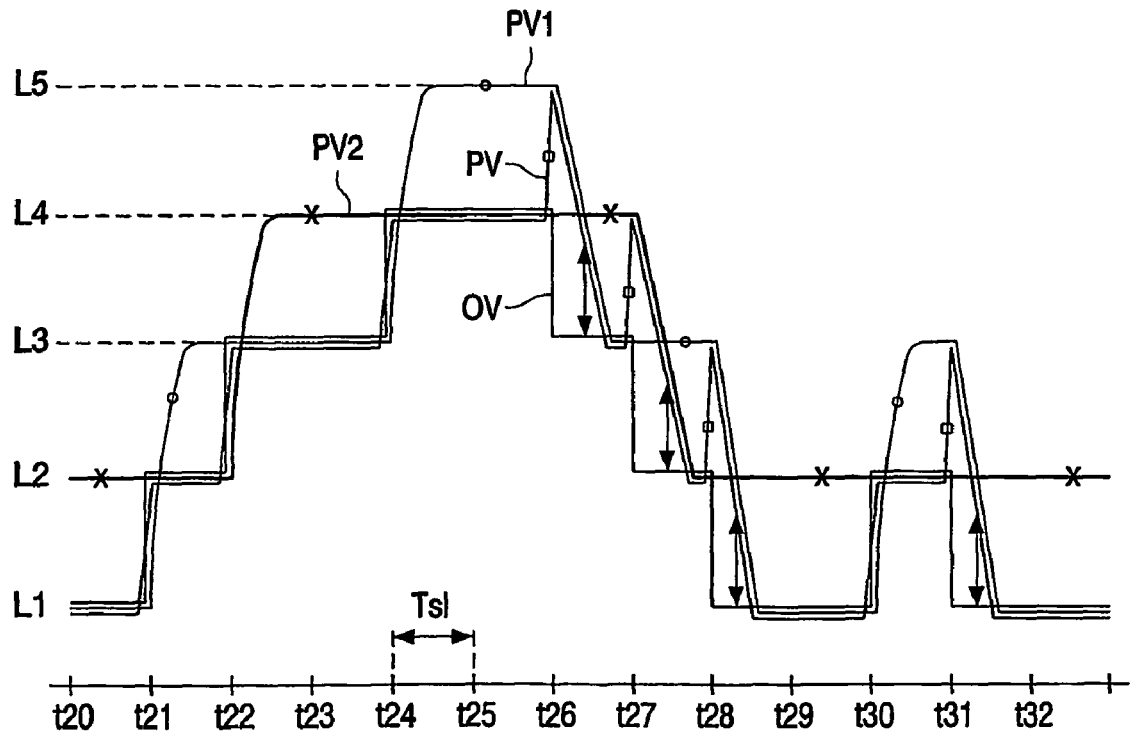
Figure 5:
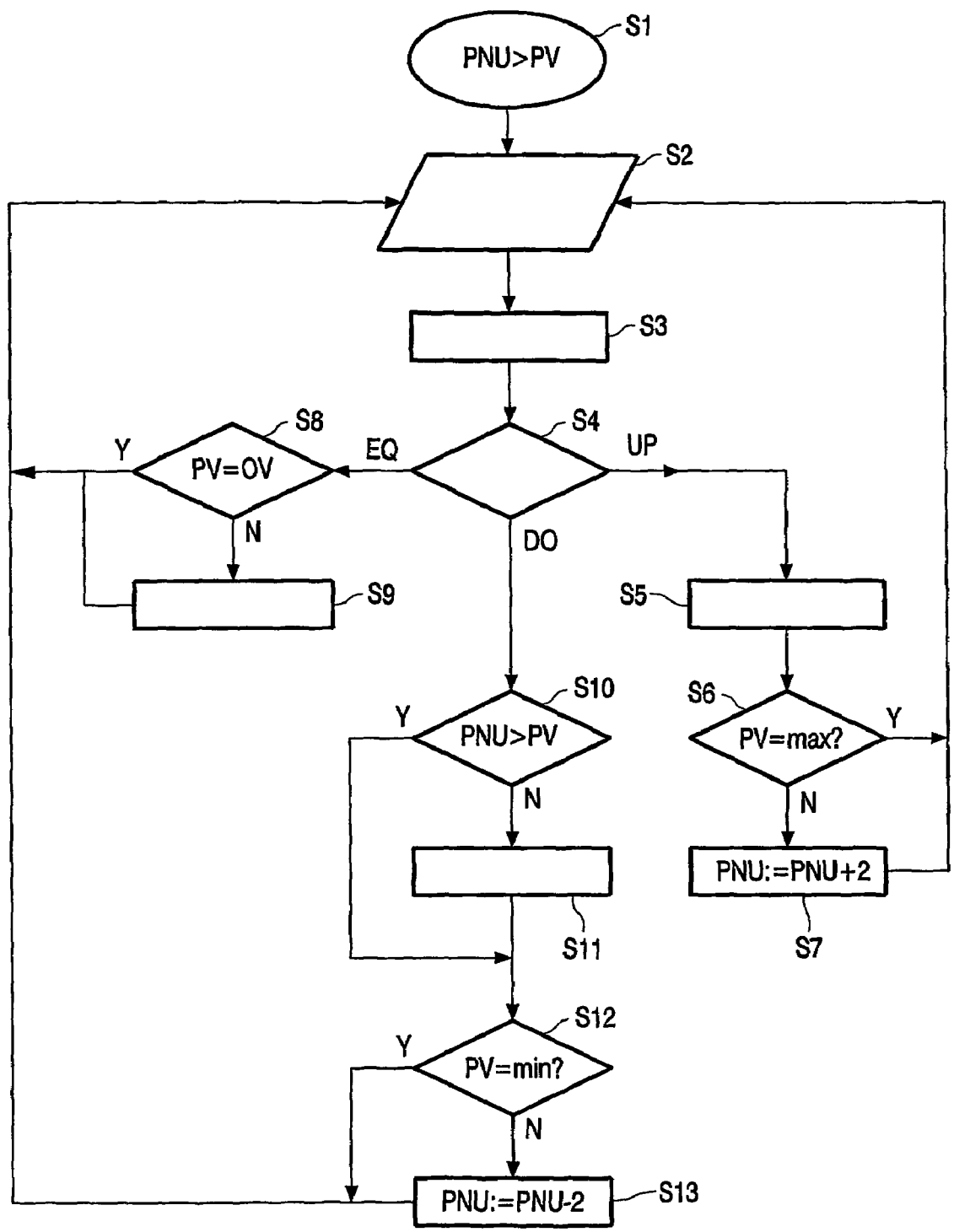
Figure 7:
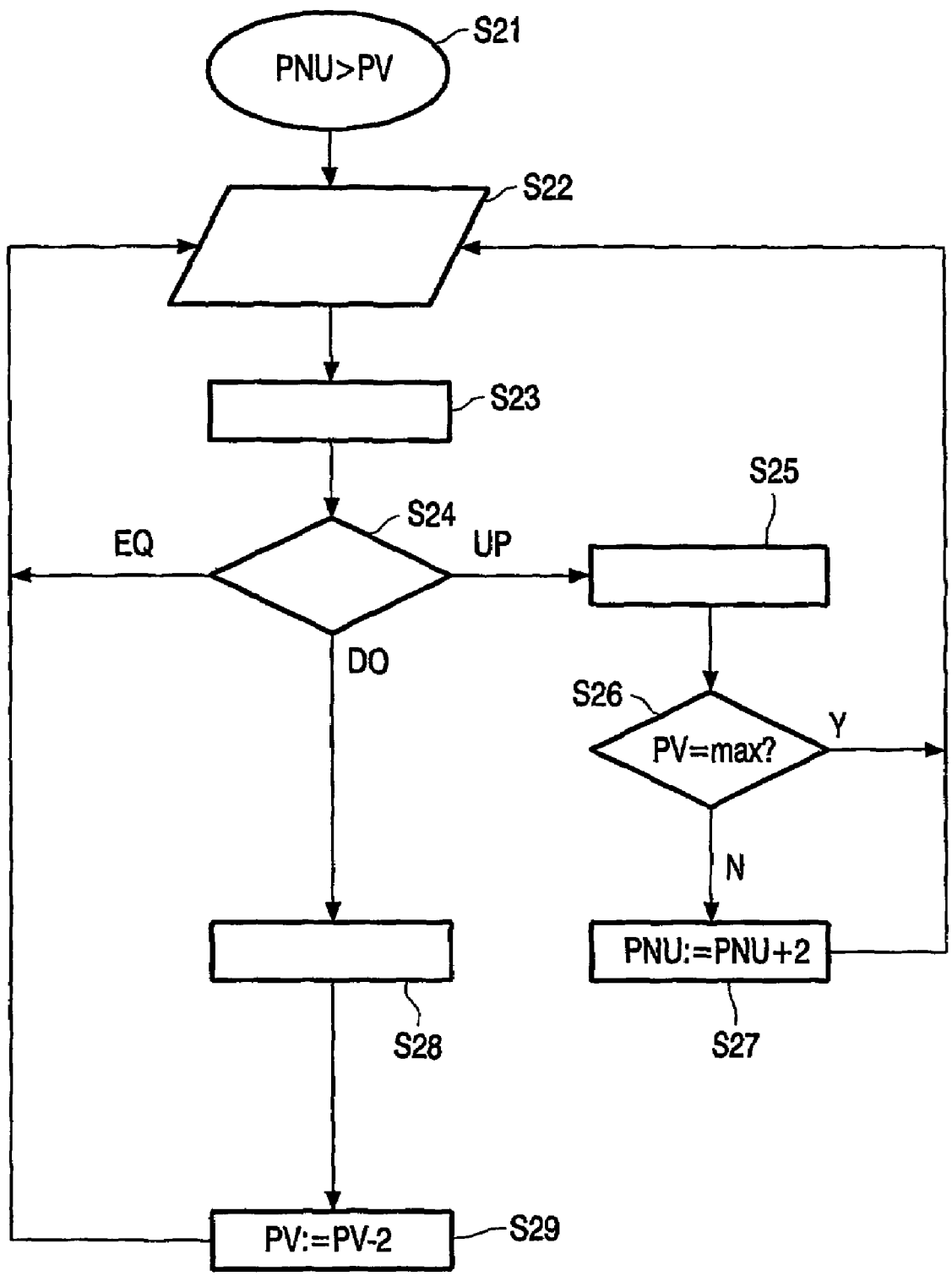
Figure 8:
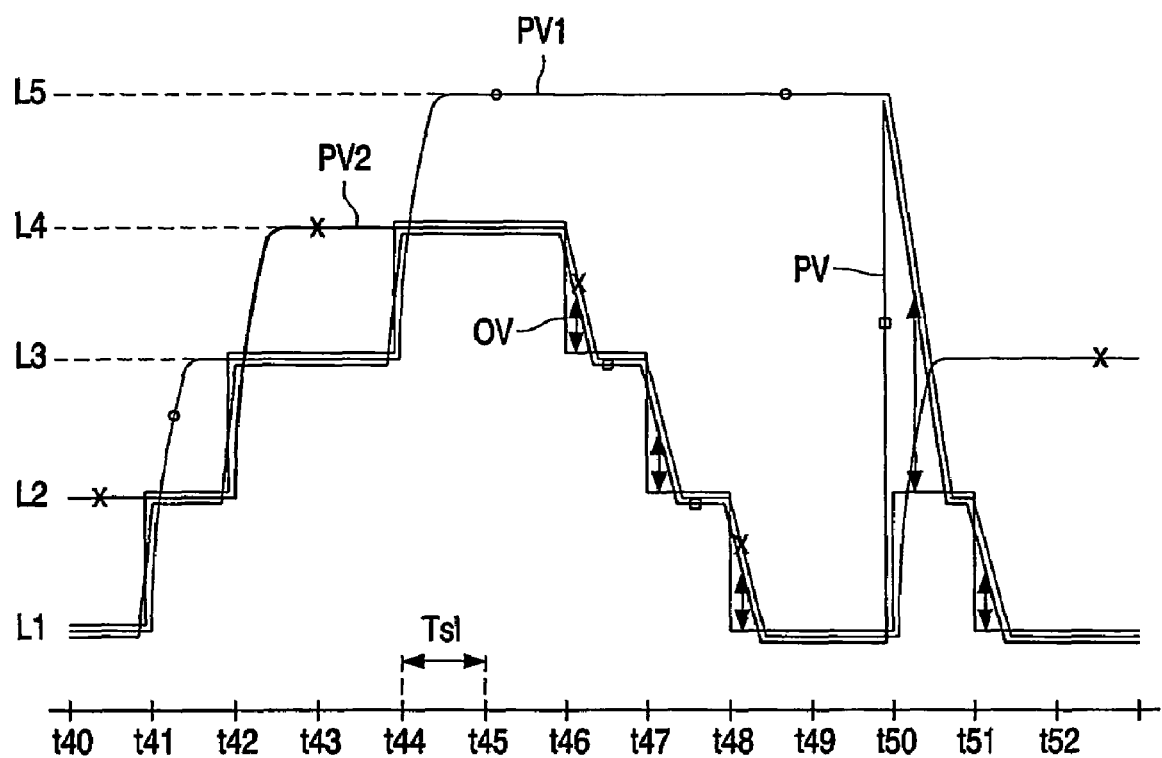
Figure 9:
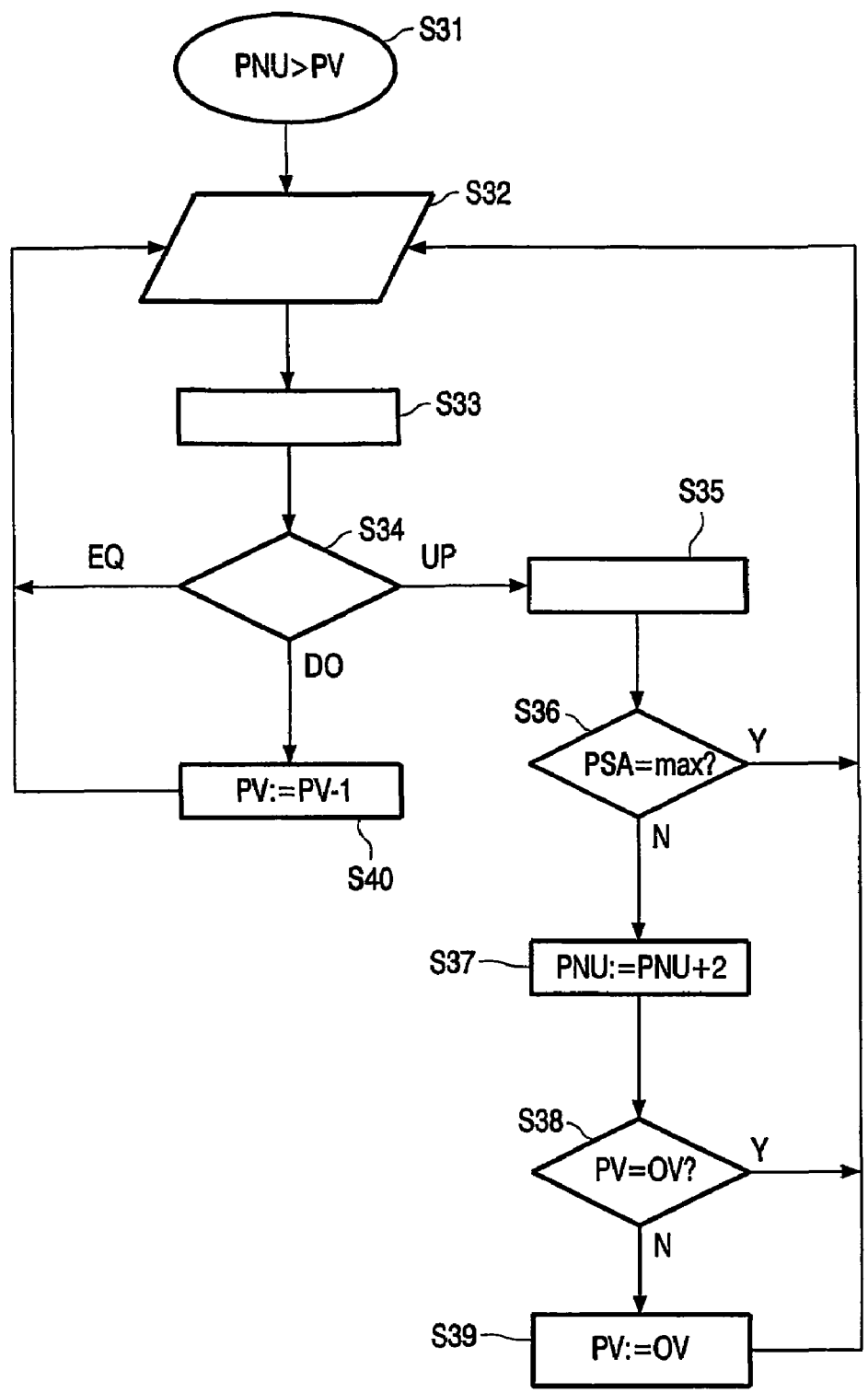
Figure 10:
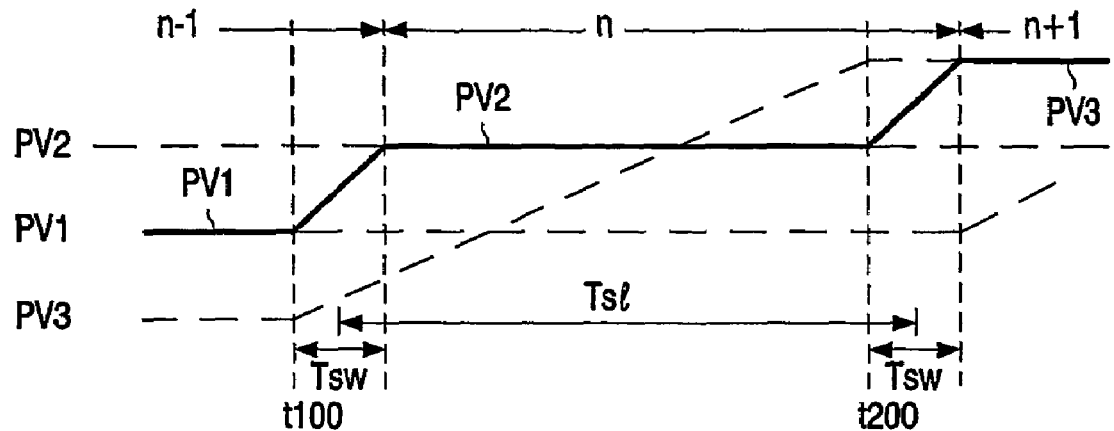
Figure 11:
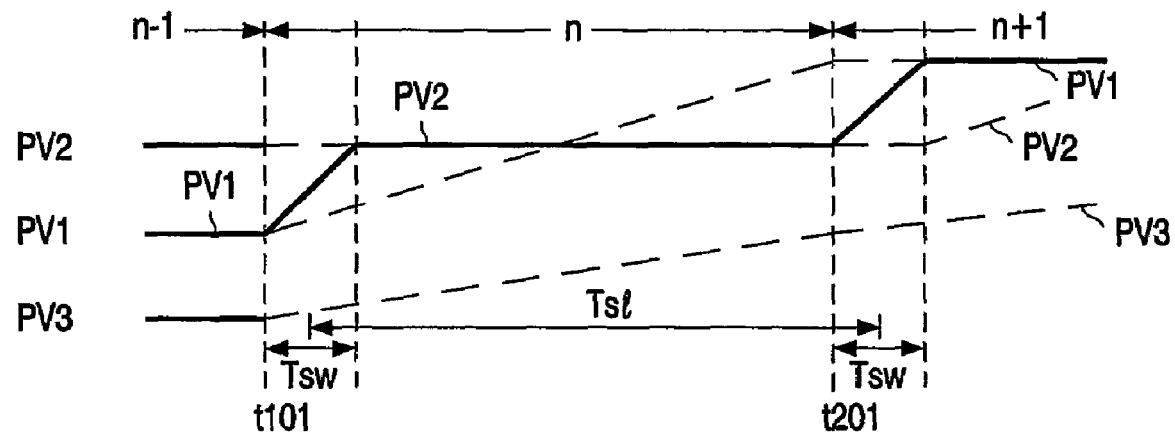

FIG. 4 shows an embodiment in accordance with the invention wherein two power supply voltages are present, FIG. 5 shows an algorithm which controls the selection of the power supply voltages of the embodiment shown in FIG. 4, FIG. 6 shows an embodiment in accordance with the invention wherein two power supply voltages are present, FIG. 7 shows an algorithm which controls the selection of the power supply voltages of the embodiment shown in FIG. 6, FIG. 8 shows an embodiment in accordance with the invention wherein two power supply voltages are present, FIG. 9 shows an algorithm which controls the selection of the power supply voltages of the embodiment shown in FIG. 8, FIG. 10 shows an embodiment in accordance with the invention wherein three power supply voltages are present, and FIG. 11 shows another embodiment in accordance with the invention wherein three power supply voltages are present The same references in different Figures refer to the same signals or to the same items performing the same function.

Figure 1:
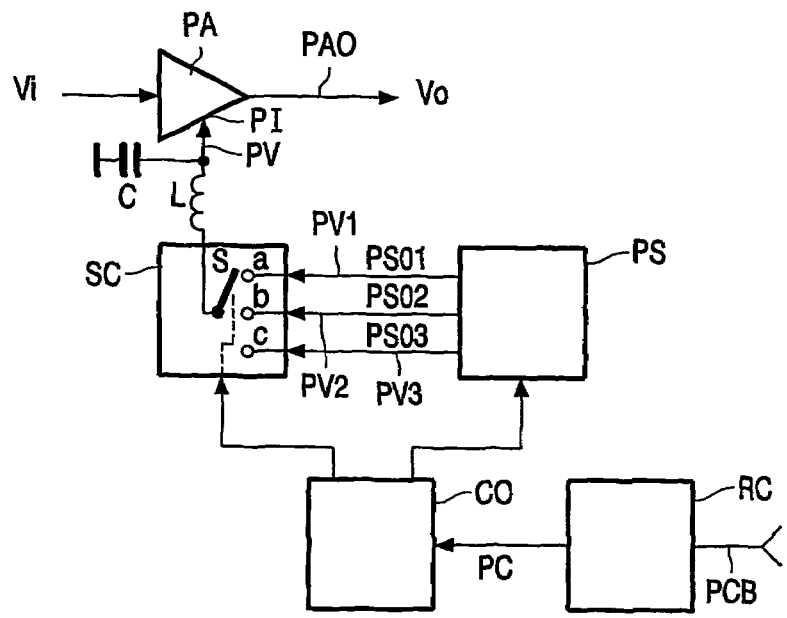
FIG. 1 shows a block diagram of a transmitter with power saving.

FIG. 1 shows a block diagram of a transmitter with power saving. The power amplifier PA receives an input signal Vi and a power supply voltage PV at a power supply input PI, and supplies a transmission signal Vo on the output PAO. The power supply PS has power supply outputs PS01, PS02, PS03 to supply power supply voltages PV1, PV2, PV3, respectively, to the switching circuit SC. The switching circuit SC has a switch S which selects between the power supply voltages PV1, PV2, PV3 at the nodes a, b, c, respectively.

The controller CO receives a power change command PC to control the position of the switch S and the levels of the power supply voltages PV1, PV2, PV3. The power change command PC may be supplied by a receiving circuit RC which receives a power control command PCB from a base station (BS) shown in FIG. 2.

The power supply voltage selected by the switch S is supplied to the power supply input PI via an inductor L. A capacitor C is arranged between the power supply input PI and ground. The optional filter, which comprises the inductor L and the capacitor C, has two functions. Firstly, the ripple of the power supply voltages PV1, PV2, PV3 is filtered, and secondly, it supplies energy to the power amplifier during a time interval in which the switch S is not connected to any of the nodes a, b, c.

In general, the transmitter operates as elucidated in the following. At a certain output power of the transmitter, the power supply voltage PV has the optimal value by selecting the most appropriate one of the power supply voltages PV1, PV2, PV3 with the switch S. If the output power of the transmitter has to be adapted, the switch is controlled to select another one of the power supply voltages PV1, PV2, PV3 fitting the new output power best. Now, the levels of the power supply voltages (or voltage if only two instead of the three power supply voltages PV1, PV2, PV3 are used) which are not selected can be changed such that when the output power of the transmitter has to be adapted a next time, the appropriate power supply voltage or voltages PV1, PV2, PV3 are available. This will be elucidated in more detail with respect to FIGS. 4 to 8. It is of course possible to use more than three power supply voltages.

Figure 2:
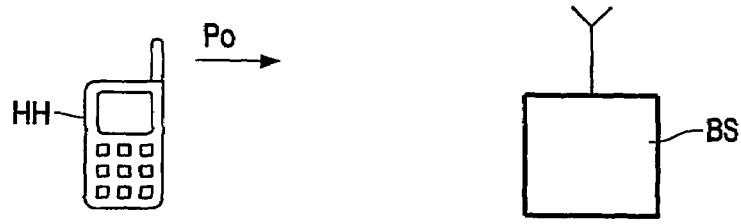
FIG. 2 shows a handheld and a base station.

FIG. 2 shows a handheld and a base station. The transmitter is a handheld HH, for example a GSM phone, which communicates with the base station BS. The power amplifier PA of the handheld HH generates the transmission signal Vo with an output power Po.

Figure 3:
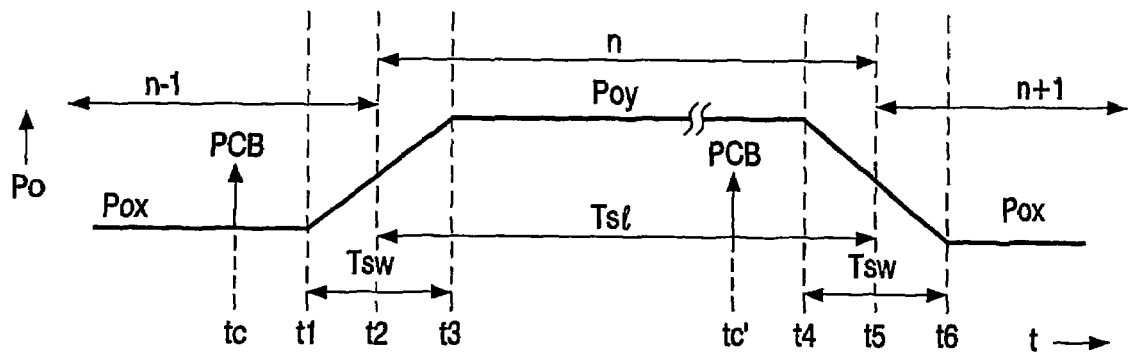
FIG. 3 shows an example of a change of the output power of the transmitter.

FIG. 3 shows an example of a change of the output power Po of the transmitter. In the power control loop, the base station BS receives the transmission signal Vo from the handheld HH and measures the received power of this signal. If required, the base station BS sends the power control command PCB to the handheld HH to adjust the output power Po of the handheld HH to an appropriate level. FIG. 3 shows an example of the timing of the power control loop for a UMTS handset HH.

In modern communication systems such as the UMTS system, time slots are used. If three consecutive time slots n−1, n, n+1 are considered, during each one of the time slots n−1, n, n+1, the output power Pox, Poy of the transmission signal has a fixed value. Each time slot n−1, n, n+1 lasts a time slot period Tsl. A transition period Tsw is available at the end of a time slot n−1, n and the start of the corresponding successive time slot n, n+1 to change the level of the output power Pox, Poy. In FIG. 3, the transition period Tsw overlaps the end of a time slot n−1, n and the start of the corresponding successive time slot n, n+1. In other standards, the transition period Tsw may be positioned differently, for example, the transition period Tsw may be positioned completely at the end of a time slot n−1, n, n+1, or completely at the start of a time slot n−1, n, n+1. The time slot n−1 lasts until instant t2, the time slot n lasts from instant t2 to instant t5, the time slot n+1 starts at instant t5. The transition period Tsw at the end of the time slot n−1 and the start of the time slot n lasts from instant t1 to instant t3, the transition period Tsw at the end of the time slot n and the start of the time slot n+1 lasts from instant t4 to instant t6.

Before instant t1, the handset supplies a transmission signal Vo with an output power Pox. At instant t1 the transition period Tsw starts. During the transition period Tsw lasting from instant t1 to instant t3 the output power has to change from Pox to Poy. Thus, during the next time slot n, from instant t3 onwards, the output power is Poy. Before the end of the time slot n, at instant t4, again a transition period Tsw starts. The output power changes from Poy to Pox such that at instant t6 within the time slot n+1, the output power is Pox again. The power control command PCB has to be issued by the base station BS before the start of the transition period Tsw as is schematically indicated by the arrow at instants tc and tc'.

FIG. 4 shows an embodiment in accordance with the invention wherein two power supply voltages are present. The levels of the two power supply voltages PV1 and PV2 supplied by the power supply PS are indicated by solid lines marked with small circles and crosses, respectively. The optimum level of the power supply voltage PV fitting the output power Po required is indicated by the waveform OV. The actual level of the power supply voltage PV supplied to the power supply input PI of the power amplifier PA is indicated by a solid line marked with small squares. The time slots Tsl occur in-between two successive ones of the instants t0 to t12. The transition periods Tsw are not indicated, but usually occur around each one of the instants t0 to t12.

The algorithm which controls the selection of the power supply voltages PV1 and PV2 is elucidated with respect to the flow chart shown in FIG. 5.

At the instant to, at step S1 the levels of the power supply voltage PV1, the optimum level OV and the actual level PV all are equal to L1. For clarity only, the waveforms in FIG. 4 are shown with slightly different levels. The level of the power supply voltage PV2 is L2 and thus higher than the level of the power supply voltage PV1. The power supply voltage PV1 is supplied as the power supply voltage PV to the power amplifier PA. Thus, the level of the non-used power supply voltage PNU is higher than the level of the power supply voltage PV.

In the step S2, the information is received indicating whether the supply voltage PV has to be increased, decreased, or left unchanged. In the step S3, the algorithm waits until the transition period Tsw starts. In step S4, the algorithm decides on the branch to select, depending on whether the power supply voltage PV should increase, decrease or stay equal.

If, at the instant t1, it is known that the output power Po has to increase one step, the branch UP is selected. In step S5, the controller CO controls the switching circuit SC to select the power supply voltage PV2 not yet used which has the appropriate level L2 to be supplied as the power supply voltage PV to the power amplifier PA. In step S6 is checked whether the power supply voltage PV supplied to the power amplifier PA has the highest possible level that can be supplied by the power supply PS; if so, step S7 is not performed and the algorithm proceeds with step S2. Thus, in this limit situation wherein the power supply PS supplies the highest possible voltage, a situation may occur wherein there is no power supply voltage available with a level higher than the selected one. In step S7, the controller CO controls the power supply PS to increase the level of the power supply voltage PV1 unused now to the level L3. This is indicated in FIG. 5 by PNU:=PNU+2, which means that the level of the non-used power supply is increased by two steps. Thus, again two power supply voltages PV1 and PV2 are available of which one (PV1) has a higher level than the other (PV2). Then, the algorithm proceeds with step S2.

At the instant t2, it is known that the output power Po again has to increase one step. The controller CO controls the switching circuit SC to select the higher power supply voltage PV1 which has the appropriate level L3 to be supplied as the power supply voltage PV to the power amplifier PA. The controller CO controls the power supply PS to increase the level of the power supply voltage PV2 to the level L4. Again two power supply voltages PV1 and PV2 are available of which one (PV2) has a higher level than the other (PV1).

If in step S4 is detected that, such as shown at the instant t3, the output power Po should not change, the algorithm follows the branch EQ and all the waveforms keep the same level. In step S8 is checked whether the power supply voltage PV is equal to the required level OV. If this is true (for example at instant t3), the algorithm proceeds with step S2, otherwise (for example at instant t9) step S9 selects the other one of the two power supply voltages PV1, PV2.

At the instant t4, it is known that the output power Po again has to increase one step again. The controller CO controls the switching circuit SC to select the power supply voltage PV2 which has the appropriate level L4 to be supplied as the power supply voltage PV to the power amplifier PA. The controller CO controls the power supply PS to increase the level of the power supply voltage PV1 to the level L5. Thus, again two power supply voltages PV1 and PV2 are available of which one (PV1) has a higher level than the other (PV2).

At the instant t5, it is known that the output power Po should not change, all the waveforms keep the same level.

If in step S4 is detected that, such as shown at the instant t6, the output power Po has to decrease one step, the algorithm follows the branch DO. In step S10, it is checked whether the non-used power supply voltage PNU has a higher level than the power supply voltage PV used. If so, although, the level L4 of the power supply voltage PV2 is one step higher than optimal, the controller CO controls the switching circuit SC to again select this power supply voltage PV2 to be supplied to the power amplifier PA and the algorithm proceeds with step S12. If not, the power supply voltage not yet used is selected in step S11 and the algorithm proceeds with step S12. In step S12 is checked whether the power supply voltage PV supplied to the power amplifier PA has the lowest possible level that can be supplied by the power supply PS. If it has, step S13 is not performed and the algorithm proceeds with step S2. Thus, in this limit situation wherein the power supply PS supplies the lowest possible voltage, a situation may occur wherein there is no power supply voltage available with a level lower than the selected one. In step S13, the controller CO controls the power supply PS to decrease the power supply voltage PV1 unused now to the level L3 below the level LA of the power supply voltage PV2. This is indicated in FIG. 5 by PNU:=PNU−2, which means that the level of the non-used power supply is decreased by two steps. The algorithm proceeds with step S2.

At the instant t7, it is known that the output power Po has to decrease one step again. Although, the level L3 of the power supply voltage PV1 is one step higher than optimal, the controller CO controls the switching circuit SC to select this power supply voltage PV1 to be supplied to the power amplifier PA. The controller CO controls the power supply PS to decrease the power supply voltage PV2 to the level L2 below the level L3 of the power supply voltage PV1.

At the instant t8, it is known that the output power Po has to decrease one step again. Although the level L2 of the power supply voltage PV2 is one step higher than optimal, the controller CO controls the switching circuit SC to select this power supply voltage PV2 to be supplied to the power amplifier PA. The controller CO controls the power supply PS to decrease the power supply voltage PV1 to the level L1 below the level L2 of the power supply voltage PV2.

At the instant t9, it is known that the output power Po has to be stable. Now, the level L1 of the power supply voltage PV1 is correct for the output power Po to be supplied. The controller CO controls the switching circuit SC to select this power supply voltage PV1 to be supplied to the power amplifier PA. The power supply voltage PV2 is kept at the level L2 above the level L1 of the power supply voltage PV1.

At the instant t10, it is known that the output power Po has to increase one step. The controller CO controls the switching circuit SC to select the power supply voltage PV2 which has the appropriate level L2 to be supplied as the power supply voltage PV to the power amplifier PA. The controller CO controls the power supply PS to increase the level of the power supply voltage PV1 to the level L3. Thus, again two power supply voltages PV1 and PV2 are available of which one (PV1) has a higher level than the other (PV2).

At the instant t11, it is known that the output power Po has to decrease one step. Although, the level L2 of the power supply voltage PV2 is one step higher than optimal, the controller CO controls the switching circuit SC to again select this power supply voltage PV2 to be supplied to the power amplifier PA. The controller CO controls the power supply PS to decrease the power supply voltage PV1 to the level L1 below the level L2 of the power supply voltage PV2.

At the instant t12, it is known that the output power Po has to be stable. Now, the level L1 of the power supply voltage PV1 is correct for the output power Po to be supplied. The controller CO controls the switching circuit SC to select this power supply voltage PV1 to be supplied to the power amplifier PA. The power supply voltage PV2 is kept at the level L2 above the level L1 of the power supply voltage PV1.

Thus, at each one of the instants t0 to t12, two power supply voltage levels are present of which always one has a level higher than required by the output power Po to be supplied by the power amplifier PA. It is therefore always possible to immediately select a higher power supply voltage if a higher output power Po is required. If the output power Po has to decrease, it is not always possible to immediately select an optimally low power supply voltage. But this only causes a minimal extra power consumption during periods of time the output power Po has to decrease.

FIG. 6 shows an embodiment in accordance with the invention wherein two power supply voltages are present. The levels of the two power supply voltages PV1 and PV2 supplied by the power supply PS are indicated by solid lines marked with small circles and crosses, respectively. The optimum level of the power supply voltage PV fitting the output power Po required is indicated by the waveform OV (see FIGS. 4 and 5). The actual level of the power supply voltage PV supplied to the power supply input PI of the power amplifier PA is indicated by a solid line marked with small squares. The time slots Tsl occur in-between two successive ones of the instants t20 to t32. The transition periods Tsw are not indicated, but usually occur around each one of the instants t20 to t32.

The algorithm which controls the selection of the power supply voltages PV1 and PV2 is elucidated with respect to the flow chart shown in FIG. 7. The steps S21 to S27 of FIG. 7 are identical with the steps S1 to S7 of FIG. 5, respectively. Thus, the same branch UP should be performed and the same algorithm is applied if in step S24 is detected that the power supply voltage PV should increase. If in step S24 is detected that the power supply voltage PV should be stable, the branch EQ is performed, which means that the algorithm proceeds with step S22. If in step S24 is detected that the power supply voltage PV should decrease, in step S28, the power supply voltage PV1, PV2 not yet used is selected to become the power supply voltage PV. In step S29 the level of this used power supply voltage PV is decreased or allowed to decrease by two steps: PV:=PV−2 and the algorithm proceeds with step S22.

In the example of a sequence of desired levels of the power supply voltage PV shown in FIG. 6, the part of the waveforms from instant t20 to instant t26 is identical with the part of the waveforms from instant t0 to instant t6 of FIG. 4, and is thus not elucidated again.

At the instant t26, it is known that the output power Po has to decrease one step. Although the level L5 of the power supply voltage PV1 is two steps higher than optimal while the level L4 of the power supply voltage PV2 is only one step higher than optimal, the controller CO controls the switching circuit SC to select the power supply voltage PV1 to be supplied to the power amplifier PA. The controller CO controls the power supply PS to decrease the power supply voltage PV1 to the level L3 below the level L4 of the power supply voltage PV2. This approach has the advantage that the power supply PS can be simply switched off until the level L3 is reached. The load of the power amplifier PA on the power supply output PS01 which supplies the power supply voltage PV1 will discharge the capacitor C present at this power supply output PS01. This is an easy way of lowering the power supply voltage PV1 which further consumes substantially no power. Thus although the power supply voltage PV is higher than optimal during some time, the power consumption is not higher than required.

At the instant t27, it is known that the output power Po has to decrease one step again. Although, the level L4 of the power supply voltage PV2 is two steps higher than optimal while the level L3 of the power supply voltage PV1 is only one step higher than optimal, the controller CO controls the switching circuit SC to select the power supply voltage PV2 to be supplied to the power amplifier PA. The controller CO controls the power supply PS to decrease the power supply voltage PV2 to the level L2 below the level L3 of the power supply voltage PV1. This approach has the advantage that the power supply PS can be simply switched off until the level L2 is reached. The load of the power amplifier PA on the power supply output PS02, which supplies the power supply voltage PV2, will discharge a capacitor present at this power supply output PS02. This is an easy way of lowering the power supply voltage PV2 which further consumes substantially no power. Thus, although the power supply voltage PV is higher than optimal for some time, the power consumption is not higher than required.

At the instant t28, it is known that the output power Po has yet to decrease one step. Although the level L3 of the power supply voltage PV1 is two steps higher than optimal while the level L2 of the power supply voltage PV2 is only one step higher than optimal, the controller CO controls the switching circuit SC to select the power supply voltage PV1 to be supplied to the power amplifier PA. The controller CO controls the power supply PS to decrease the power supply voltage PV1 to the level L1 below the level L2 of the power supply voltage PV2.

At the instant t29, it is known that the output power Po has to be stable. Now, the level L1 of the power supply voltage PV1 is correct for the output power Po to be supplied. The controller CO controls the switching circuit SC to select this power supply voltage PV1 to be supplied to the power amplifier PA. The power supply voltage PV2 is kept at the level L2 above the level L1 of the power supply voltage PV1.

At the instant t30, it is known that the output power Po has to increase one step. The controller CO controls the switching circuit SC to select the power supply voltage PV2 which has the appropriate level L2 to be supplied as the power supply voltage PV to the power amplifier PA. The controller CO controls the power supply PS to increase the level of the power supply voltage PV1 to the level L3. Thus, again two power supply voltages PV1 and PV2 are available of which one (PV1) has a higher level than the other (PV2).

At the instant t31 the same situation occurs as at instant t28 and the same actions are taken.

Thus, at every one of the instants t20 to t32 two power supply voltage levels are present of which always one has a level high enough to supply the power amplifier PA to be able to supply the required output power Po. It is therefore always possible to immediately select a higher power supply voltage if a higher output power Po is required. If the output power Po has to decrease, it is not always possible to immediately select an optimally low power supply voltage. But, this substantially causes no extra power consumption during periods in time the output power Po has to decrease because the energy already stored in capacitors is used.

FIG. 8 shows an embodiment in accordance with the invention wherein two power supply voltages are present. The levels of the two power supply voltages PV1 and PV2 supplied by the power supply PS are indicated by solid lines marked with small circles and crosses, respectively. The optimum level of the power supply voltage PV fitting the output power Po required is indicated by the waveform OV. The actual level of the power supply voltage PV supplied to the power supply input PI of the power amplifier PA is indicated by a solid line marked with small squares. The time slots Tsl occur between two successive ones of the instants t40 to t52. The transition periods Tsw are not indicated, but usually occur around every one of the instants t40 to t52.

The algorithm which controls the selection of the power supply voltages PV1 and PV2 is elucidated with respect to the flow chart shown in FIG. 9. The steps S31 to S37 of FIG. 9 are identical with the steps S1 to S7 of FIG. 5, respectively. If in step S34 is detected that the power supply voltage PV should be stable, the branch EQ is followed, which means that the algorithm proceeds with step S32. If in step S34 is detected that the power supply voltage PV should decrease, in step S40 the level of this power supply voltage PV used is decreased by one step: PV:=PV−1 and the algorithm proceeds with step S32. If in step S34 is detected that the power supply voltage PV should increase, the branch UP is performed. The steps S35, S36, S37 are identical with the steps S5, S6, S7 of FIG. 5, respectively. After step S37, wherein the level of the non-used power supply voltage PNU is increased in two steps, in step S38 is checked whether the level of the power supply voltage PV used is equal to the desired level OV. If it is, the algorithm proceeds with step S32. If not, in step S39, the power supply voltage PV used is decreased to or is allowed to decrease to the desired level OV optimally fitting the output power Po to be supplied.

In the example of a sequence of desired levels of the power supply voltage PV shown in FIG. 8, the part of the waveforms from instant t40 to instant t46 is identical with the part of the waveforms from instant t0 to instant t6 of FIG. 4, and is thus not elucidated again.

At the instant t46, it is known that the output power Po has to decrease one step. Although the level L4 of the power supply voltage PV2 is one step higher than optimal, the controller CO controls the switching circuit SC to select this power supply voltage PV2 to be supplied to the power amplifier PA. The controller CO controls the power supply PS to allow the power supply voltage PV2 to drop to the level L3 and to keep the power supply voltage PV1 constant at the level L5. The drop of the voltage PV2 may again be obtained by discharging the capacitor connected to the power supply output PSO2.

At the instant t47, it is known that the output power Po has to decrease one step again. Although the level L3 of the power supply voltage PV2 is one step higher than optimal, the controller CO controls the switching circuit SC to select this power supply voltage PV2 to be supplied to the power amplifier PA. The controller CO controls the power supply PS to allow the power supply voltage PV2 to drop to the level L2 and to keep the power supply voltage PV1 constant at the level L5.

At the instant t48, it is known that the output power Po has yet to decrease one step. Although the level L2 of the power supply voltage PV2 is one step higher than optimal, the controller CO controls the switching circuit SC to select this power supply voltage PV2 to be supplied to the power amplifier PA. The controller CO controls the power supply PS to allow the power supply voltage PV2 to drop to the level L1 and to keep the power supply voltage PV1 constant at the level L5.

At the instant t49, it is known that the output power Po has to be stable. Now, the level L1 of the power supply voltage PV2 is correct for the output power Po to be supplied. The controller CO controls the switching circuit SC to select this power supply voltage PV2 to be supplied to the power amplifier PA. The power supply voltage PV1 is kept at the level L5 above the level L1 of the power supply voltage PV2.

At the instant t50, it is known that the output power Po has to increase by one step. The controller CO controls the switching circuit SC to select the power supply voltage PV1 although its level L5 is much higher than optimal. The controller CO controls the power supply PS to allow the power supply voltage PV1 to drop to the level L2 and the power supply voltage PV2 to increase to the level L3 above the level L2 of the power supply voltage PV1.

At the instant t51 a comparable situation occurs to the instant t48 and similar actions are taken.

FIG. 10 shows an embodiment in accordance with the invention wherein three power supply voltages are present. In this embodiment, the controller CO controls the switching circuit SC to select one of the power supply voltages PV1, PV2 and PV3 to be supplied as the power supply voltage PV to the power amplifier PA. The controller CO controls the power supply PS such that always one of the two non-selected power supply voltages has a level below the level of the selected power supply voltage and the other one of the non-selected power supply voltages has a level above the selected power supply voltage.

Three successive time slots n−1, n and n+1 are shown. By way of example, the transition periods Tsw occur at the end of each time slot n−1, n and n+1. Before the instant t100, during the time slot n−1, the controller CO controls the switching circuit SC to select the power supply voltage PV1 to be supplied as the power supply voltage PV to the power amplifier PA. The power supply voltage PV2 has a predetermined level above the level of the power supply voltage PV1, and the power supply voltage PV3 has a predetermined level below the level of the power supply voltage PV1.

The output power of the power amplifier PA should have a higher level during the time slot n than during the time slot n−1. During the transition period Tsw, but preferably at instant t100, the controller CO controls the switch S to select the power supply voltage PV2 as the power supply voltage PV of the power amplifier PA. During the time slot n, outside the transition period Tsw, the power supply voltage PV1 not selected now is kept constant and the non-selected power supply voltage PV3 is varied to the predetermined higher level than the power supply voltage PV2 selected now. Before the end of the time slot n, when the next transition period Tsw starts at instant t200, again a higher and a lower power supply voltage PV3, PV1 than the selected power supply voltage PV2, respectively, are available. If again the output power of the transmitter has to increase, during the transition period Tsw, preferably at instant t200, the changed power supply voltage PV3 is selected. During the time slot n+1, outside the transition period Tsw, the power supply voltage PV2 is kept constant, while the power supply voltage PV1 is changed to get the predetermined higher level than the power supply voltage PV3 selected now. Before the end of the time slot n+1, again a higher and a lower power supply voltage PV1, PV2 will be available to select from.

In most wireless and communication standards, the power amplifier PA may have to change its output power during the periodically occurring transition periods Tsw. Usually, these standards specify that the average output power Po to be supplied during two consecutive time slots n−1 and n, may change a predetermined amount only, for example, ±1 dB or ±2 dB, or ±3 dB. Thus, each time the actual value of the output power Po of the power amplifier PA has to change, only two possibilities are envisaged. Consequently, the power supply voltage PV of the power amplifier PA in a next time slot n, has to be equal, or has to increase or decrease a fixed amount. If at all times besides the selected power supply voltage which is supplied to the power amplifier PA, also a power supply voltage with the required higher level and a power supply voltage with the required lower level is available, it is possible to select the required power supply voltage PV during the transition period Tsw preceding the next time slot n. Thus, even when the instant at which it becomes clear that another output power Po is required, occurs at the start t200 of the transition period Tsw, it is possible to switch to the required power supply voltage without having to change the level of the power supply voltages PV1, PV2, PV3 within the short transition period Tsw.

It is possible to use more than three power supply voltages PV1, PV2, PV3, for example; five power supply voltages may be used. From the four non-selected power supply voltages, two have different levels above the level of the selected power supply voltage and two have different levels below the level of the selected power supply voltage. This is advantageous because the control loop is able to order different steps of power change, such as, for example, +/−1 dB or +/−2 dB power changes. As the substantially optimal power supply voltages for these possible output powers are available, it is possible to switch over to the correct one of the power supply voltages within a short period of time. If seven different power supply voltages are generated, it is possible to immediately implement a switching to one of these power supply voltages fitting the corresponding one of seven possible output powers.

Thus, this embodiment in accordance with the invention does not depend on when exactly the command PCB that the output power Po has to be changed is received, as long as this command PCB is available before the start of the next transition period Tsw, the most appropriate power supply voltage PV1, PV2, PV3 for the next time slot n+1 can be selected in time by controlling the switch S. This is important because, in most telecommunication systems, it is the base station BS that commands the user equipment (the transmitter, or hand held) HH to change its output power Po. This command PCB is sent to the user equipment HH that must receive and decode it to obtain the command PC for controlling the power state of the user equipment HH. The user equipment HH may introduce an unknown delay from the instant the command PCB is transmitted by the base station BS until the command PC is decoded. In the embodiment in accordance with the invention, these delays will not influence the time available to change the level(s) of the non-selected power supply voltage(s).

Special situations occur if the power amplifier PA is operating at the minimum or maximum power supply voltage available. If the power supply voltage PV of the power amplifier has its minimum value, the selected power supply voltage has the minimum value, and at least one of the non-selected power supply voltages has a value a predetermined amount higher than the minimum value. The level of the other non-selected power supply voltage is not important, this level may be the minimum level or the predetermined higher level, or even a higher level. In the same manner the levels can be selected with respect to the maximum level.

FIG. 11 shows another embodiment in accordance with the invention wherein three power supply voltages are present. In this embodiment, the power supply PS supplies three power supply voltages PV1, PV2 and PV3. Three successive time slots n−1, n and n+1 are shown. Now, by way of example, the transition periods Tsw occur at the start of the time slots n−1, n and n+1.

During the time slot n−1, the controller CO controls the switch S to supply the power supply voltage PV1 to the power amplifier PA as the power supply voltage PV. The non-selected power supply voltage PV2 has a predetermined higher level than the selected power supply voltage PV1. The non-selected power supply voltage PV3 has a predetermined lower level than the selected power supply voltage PV1.

The output power Po of the power amplifier PA should have a higher level during the time slot n than during the time slot n−1. During the transition period Tsw starting at instant t101, preferably substantially at the instant t101, the controller CO controls the switch S to select the power supply voltage PV2 as the power supply voltage PV of the power amplifier PA. During the time slot n, the power supply voltage PV1 not selected now is varied to obtain the predetermined level above the level of the selected power supply voltage PV2. The level of the non-selected power supply voltage PV3 is increased to obtain the predetermined lower level than the level of the selected power supply voltage PV2. Before or at the end of the time slot n, at instant t201, again a higher and a lower power supply voltage PV1, PV3 than the selected power supply voltage PV2 are available. If again the output power Po of the transmitter has to increase during the transition period Tsw starting at instant t201, preferably substantially at instant t201, the changed power supply voltage PV1 is selected. During the time slot n+1, outside the transition period Tsw, the power supply voltage PV1 is kept constant, while both non-selected power supply voltages PV2, PV3 are varied to obtain the predetermined higher and lower level than the level of the selected power supply voltage PV1. Before the end of the time slot n+1, again a higher and a lower power supply voltage PV2, PV3 will be available to select from.

The non-selected power supply voltage that has the level nearest the selected power supply voltage is changed to cross the level of the selected power supply voltage. The variation of both non-selected power supply voltages has the advantage that the maximum variation is less than if only one of the non-selected power supply voltages is varied.

To conclude, in a preferred embodiment of the invention, the transmitter comprises a power amplifier PA with a power-supply input PI and an output PAO to supply a transmission signal Vo with an output power Po. A power supply PS has power supply outputs PS01, PS02 to supply a first power supply voltage PV1 with a first level and a second power supply voltage PV2 with a second level higher than the first level. A switching circuit SC is arranged between the power supply outputs PS01, PS02 and the power supply input PI to supply a selected one of the first power supply voltage PV1 or the second power supply voltage PV2 to the power amplifier PA. A controller CO supplies, in response to a first power change command PC indicating a first desired level of the output power Po, a control signal to the switching circuit SC to supply the first power supply voltage PV1 to the power supply input PI. In response to a second power change command PC indicating a second desired level of the output power Po and succeeding the first power change command PC, the controller CO supplies the control signal to the switching circuit SC to supply either the first power supply voltage PV1 or the second power supply voltage PV2 to the amplifier power supply input PI depending on values of said first desired level and said second desired level. The controller CO controls the power supply PS to vary, if required, a level of at least one of the power supply voltages PV1, PV2 to always have one of the power supply voltages available with a level suitable for increasing the output power P0, if required, substantially instantaneously.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transmitter comprising:
   a power amplifier having a power supply input and an output for supplying a transmission signal with an output power,
   a power supply having power supply outputs for supplying a first power supply voltage having a first level and a second power supply voltage having a second level being higher than the first level,
   a switching circuit arranged between the power supply outputs and the power-supply input, and
   a controller for supplying, in response to a first power change command indicating a first desired level of the output power, a control signal to the switching circuit to supply the first power supply voltage to the power supply input, and for supplying, in response to a second power change command indicating a second desired level of the output power and succeeding the first power change command, the control signal to the switching circuit to supply either the first power supply voltage or the second power supply voltage to the amplifier power supply input depending on values of said first desired level and said second desired level;
   wherein the transmitter is arranged for operation in a transmission system based on time slots, and wherein the first power change command indicates a value of the output power required during a time slot starting after an instant of occurrence of the first power change command, and wherein the second power change command indicates a value of the output power required during a next time slot succeeding the first mentioned time slot and starting after an instant of occurrence of the second power change command.

2. A transmitter as claimed in claim 1, wherein the transmitter is a handheld apparatus and further comprises a receiving circuit for receiving a power control command from a base station to supply the first power change command and the second power change command.

3. A transmitter as claimed in claim 1, wherein the controller is arranged
   for supplying the control signal to the switching circuit to supply the second power supply voltage to the power amplifier at substantially an instant the second power change command indicates that the output power has to increase, or at the latest at a start of the next time slot, and
   for controlling the power supply to increase the first level to above the second level before a start of a time slot succeeding the next time slot.

4. A transmitter as claimed in claim 1, wherein the controller is arranged for supplying the control signal to the switching circuit to supply the first power supply voltage to the power amplifier at substantially a start of the next time slot if the second power change command indicates that the output power has to decrease, and for controlling the power supply to decrease the second level below the first level.

5. A transmitter as claimed in claim 4, wherein the controller is arranged for supplying the control signal to the switching circuit to supply the second power supply voltage after the second level decreased below the first level.

6. A transmitter as claimed in claim 4, wherein the controller is arranged for supplying the control signal to the switching circuit to supply the second power supply voltage at substantially an instant a third power change command is received during the next time slot, or at a start of a time slot succeeding the next time slot, if the third power change command indicates that still the lower output power indicated by the second power change command is required.

7. A transmitter as claimed in claim 4, wherein the controller is arranged for supplying the control signal to the switching circuit to supply the second power supply voltage at substantially an instant a third power change command is received during the next time slot, or at a start of a time slot succeeding the next time slot, if the third power change command indicates that a lower output power than indicated by the second power change command is required.

8. A transmitter as claimed in claim 1, wherein the controller is arranged for supplying the control signal to the switching circuit to supply the second power supply voltage to the power amplifier at substantially the instant the second power change command is received, or at substantially a start of the next time slot, if the second power change command indicates that the output power has to decrease, and for controlling the power supply to allow the second level to drop, while the first level is kept substantially constant.

9. A transmitter as claimed in claim 1, wherein the controller is arranged for supplying the control signal to the switching circuit to supply the first power supply voltage to the power amplifier at substantially the instant the second power change command indicates that the output power has to decrease, and for controlling the power supply to allow the first level to drop.

10. A transmitter as claimed in claim 9, wherein the controller is arranged for controlling the power supply to keep the level of the non-used second power supply voltage substantially constant.

11. A transmitter as claimed in claim 1, wherein the power supply is arranged for supplying a third power supply voltage having a third level, and wherein the controller is arranged for dynamically controlling the power supply to supply the second level which is higher than the first level, and the third level which is lower than the first level.

12. A transmitter as claimed in claim 11, wherein the controller is arranged for controlling the switching circuit to supply either the first power supply voltage, the second power supply voltage, or the third power supply voltage to the amplifier power supply input, depending on whether the second power change command indicates that the output power has to be stable, to increase, or to decrease, respectively.

13. A transmitter as claimed in claim 11, wherein the controller is arranged for controlling
the switching circuit to supply either the second power supply voltage or the third power supply voltage to the amplifier power supply input if the output power has to be changed, and
the power supply to only adapt the second level or the third level depending on whether the second level or the third level has the largest difference from a level of a power supply voltage supplied to the amplifier power supply input.

14. A transmitter as claimed in claim 11, wherein the controller is adapted for controlling
the switching circuit to supply either the second power supply voltage or the third power supply voltage to the amplifier power supply input if the output power has to be changed, and
the power supply to adapt
(i) the first level and the third level if the second power supply voltage is supplied to the amplifier power supply input, wherein the first level is controlled for exceeding the second level, or
(ii) the first level and the second level if the third power supply voltage is supplied to amplifier power supply input, wherein the first level is controlled for exceeding the third level.

15. A method in a transmitter comprising a power amplifier having a power supply input and an output for supplying a transmission signal with an output power, and a power supply having power supply outputs, for supplying a first power supply voltage having a first level and a second power supply voltage having a second level, higher than the first level, the method comprising:
controlling, the first power supply voltage to be supplied to the power supply input, in response to a first power change command indicating a first desired level of the output power, and
controlling, either the first power supply voltage or the second power supply voltage to be supplied to the amplifier power-supply input in response to a second power change command indicating a second desired level of the output power and succeeding the first power change command, depending on values of said first desired level and said second desired level;
wherein the transmitter is arranged for operation in a transmission system based on time slots, and wherein the first power change command indicates a value of the output power required during a time slot starting after an instant of occurrence of the first power change command, and wherein the second power change command indicates a value of the output power required during a next time slot succeeding the first mentioned time slot and staffing after an instant of occurrence of the second power change command.

16. A system comprising a base station and a transmitter comprising:
a power amplifier having a power supply input and an output for supplying a transmission signal with an output power,
a power supply having power supply outputs for supplying a first power supply voltage having a first level and a second power supply voltage having a second level, higher than the first level,
a switching circuit arranged between the power supply outputs and the power supply input, and
a controller for supplying a control signal to the switching circuit in response to a first power change command indicating a first desired level of the output power, to supply the first power supply voltage to the power-supply input, and for supplying, the control signal to the switching circuit, in response to a second power change command indicating a second desired level of the output power and succeeding the first power change command to supply either the first power supply voltage or the second power supply voltage to the amplifier power supply input
depending on values of said first desired level and said second desired level;
wherein the transmitter is arranged for operation in a transmission system based on time slots, and wherein the first power change command indicates a value of the output power required during a time slot starting after an instant of occurrence of the first power change command, and wherein the second power change command indicates a value of the output power required during a next time slot succeeding the first mentioned time slot and staffing after an instant of occurrence of the second power change command.

17. A transmitter comprising:
a power amplifier having a power supply input and an output for supplying a transmission signal with an output power,
a power supply having power supply outputs for supplying a first power supply voltage having a first level and a second power supply voltage having a second level being higher than the first level,
a switching circuit arranged between the power supply outputs and the power-supply input, and
a controller for supplying, in response to a first power change command indicating a first desired level of the output power, a control signal to the switching circuit to supply the first power supply voltage to the power supply input, and for supplying, in response to a second power change command indicating a second desired level of the output power and succeeding the first power change command, the control signal to the switching circuit to supply either the first power supply voltage or the second power supply voltage to the amplifier power supply input depending on values of said first desired level and said second desired level;
wherein the power supply is arranged for supplying a third power supply voltage having a third level, and wherein the controller is arranged for dynamically controlling the power supply to supply the second level which is higher than the first level, and the third level which is lower than the first level; and
wherein the controller is arranged for controlling
the switching circuit to supply either the second power supply voltage or the third power supply voltage to the amplifier power supply input if the output power has to be changed, and
the power supply to only adapt the second level or the third level depending on whether the second level or the third level has the largest difference from a level of a power supply voltage supplied to the amplifier power supply input.

18. A transmitter comprising:
a power amplifier having a power supply input and an output for supplying a transmission signal with an output power,
a power supply having power supply outputs for supplying a first power supply voltage having a first level and a second power supply voltage having a second level being higher than the first level, a switching circuit arranged between the power supply outputs and the power-supply input, and a controller for supplying, in response to a first power change command indicating a first desired level of the output power, a control signal to the switching circuit to supply the first power supply voltage to the power supply input, and for supplying, in response to a second power change command indicating a second desired level of the output power and succeeding the first power change command, the control signal to the switching circuit to supply either the first power supply voltage or the second power supply voltage to the amplifier power supply input depending on values of said first desired level and said second desired level;

wherein the power supply is arranged for supplying a third power supply voltage having a third level, and wherein the controller is arranged for dynamically controlling the power supply to supply the second level which is higher than the first level, and the third level which is lower than the first level;

wherein the controller is adapted for controlling the switching circuit to supply either the second power supply voltage or the third power supply voltage to the amplifier power supply input if the output power has to be changed, and the power supply to adapt
  (i) the first level and the third level if the second power supply voltage is supplied to the amplifier power supply input, wherein the first level is controlled for exceeding the second level, or
  (ii) the first level and the second level if the third power supply voltage is supplied to amplifier power supply input, wherein the first level is controlled for exceeding the third level.

* * * * *